United States Patent [19]

Eguchi

[11] Patent Number: 4,524,377
[45] Date of Patent: Jun. 18, 1985

[54] INTEGRATED CIRCUIT

[75] Inventor: Hirotugu Eguchi, Tokyo, Japan

[73] Assignee: NEC Corporation, Tokyo, Japan

[21] Appl. No.: 579,283

[22] Filed: Feb. 14, 1984

Related U.S. Application Data

[63] Continuation of Ser. No. 265,003, May 20, 1981.

[30] Foreign Application Priority Data

May 15, 1981 [JP] Japan ................................. 55-64752

[51] Int. Cl.³ .................... H01L 29/90; H01L 29/04; H01L 27/02; H01L 23/48
[52] U.S. Cl. ...................................... 357/59; 357/71; 357/42; 357/13
[58] Field of Search ...................... 357/41, 59, 42, 13

[56] References Cited

U.S. PATENT DOCUMENTS

| | | | |
|---|---|---|---|
| 4,085,498 | 4/1978 | Rideout | 357/59 |
| 4,178,674 | 12/1979 | Liu et al. | 357/59 |
| 4,180,826 | 12/1979 | Shappir | 357/59 |
| 4,240,195 | 12/1980 | Clemens et al. | 357/59 |
| 4,265,685 | 5/1981 | Seki | 357/23 S |
| 4,272,880 | 6/1981 | Pashley | 357/42 |
| 4,282,648 | 8/1981 | Yu et al. | 357/42 |
| 4,320,312 | 3/1982 | Walker et al. | 357/91 |
| 4,322,736 | 3/1982 | Sasaki et al. | 357/59 |

FOREIGN PATENT DOCUMENTS

| | | | |
|---|---|---|---|
| 51155308 | 7/1978 | Japan | 357/59 R |
| 55-50788 | 11/1981 | Japan | 357/59 |

OTHER PUBLICATIONS

Mitterer & Schulte, MOS-RAM-Speicherzellen . . . ", Jul. 1977, vol. 9, No. 7, pp. 19-22, Elektronik-Anzeiger.
Garnache, R. R., "Complimentary FET Memory Cell", IBM Tech. Disc. Bull., vol. 18, No. 12, May 1976, pp. 3947-3948.
Walker et al, "Four Transistor Static Memory Cells", IEDM Tech. Digest, 1977.

Primary Examiner—Andrew J. James
Assistant Examiner—Jerome Jackson
Attorney, Agent, or Firm—Sughrue, Mion, Zinn Macpeak & Seas

[57] ABSTRACT

A high-density integrated circuit employing different first and second channel types of insulated gate field effect transistors is disclosed, which comprises at least three stacked wiring layers, the lowest layer being formed of polycrystalline silicon and including silicon gates of the transistors, one of the upper layers being formed of polycrystalline silicon and used for feeding a power supply to some of the transistors and being connected to at least one well region on which the first channel type of transistors are formed, and the other of the upper layers being formed of high-conductivity metal.

13 Claims, 11 Drawing Figures

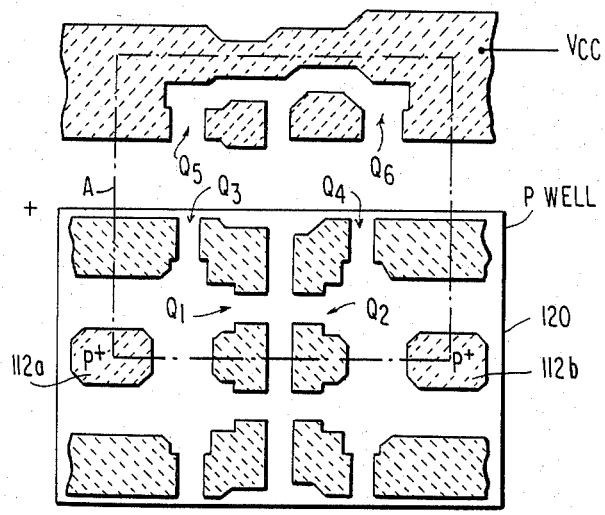
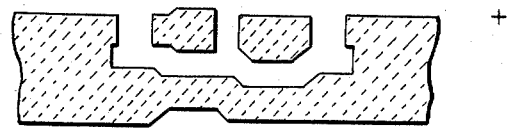
P TYPE REGION
N TYPE REGION
FIG. 5A PRIOR ART
FIG. 5B PRIOR ART
FIG. 5C PRIOR ART
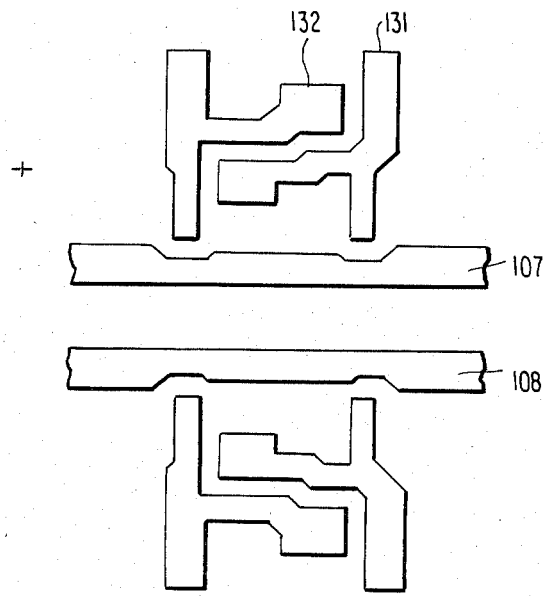
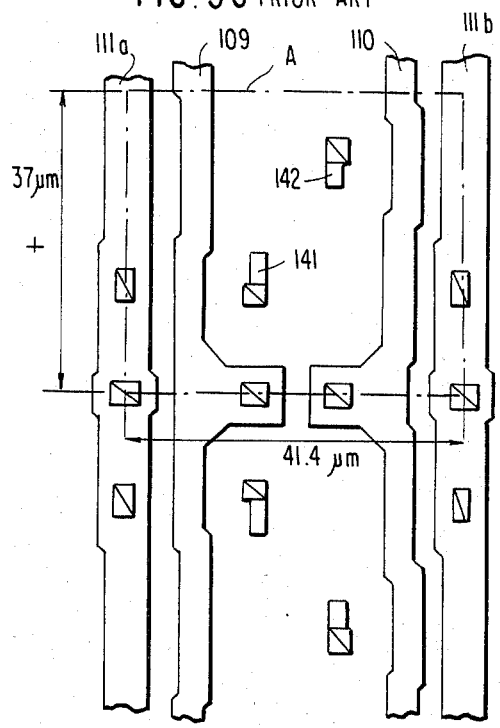
 CONTACT

▨ P TYPE REGION
▧ N TYPE REGION

◪ CONTACT

◪ CONTACT

INTEGRATED CIRCUIT

This application is a continuation of application Ser. No. 265,003, filed May 20, 1981.

BACKGROUND OF THE INVENTION

The present invention relates to an integrated circuit, and more particularly to a memory integrated circuit of so-called CMOS type where different channel types of insulated-gate field-effect transistors are employed.

CMOS circuits have been widely used because of their low power consumption, in which P type and N type field effect transistors are employed. In general, a CMOS circuit arrangement is formed on a semiconductor substrate of a first conductivity type provided with well regions of a second conductivity type opposite to the first conductivity formed therein in order to arrange both of P and N channel transistors on the same semiconductor chip. In this arrangement, it is required to provide the substrate and the well region with ohmic contacts for potential sources ($V_{CC}$ potential and $V_{SS}$ potential).

In the CMOS circuit, however, as is well known, a current triggered by an external noise voltage or the like flows through the substrate or the well region, and a voltage drop due to this current acts as a dominant factor deciding the degree of occurrence of a parasitic thyristor effect, that is, a so-called latch-up phenomenon caused in the CMOS structure. Accordingly, methods for preventing occurrence of this latch-up phenomenon have been performed such that a part of the well region or the substrate is made of low resistance layer by increasing the impurity concentration thereof, or the supplying of potential for the well region or the substrate is effected by performing the connection with a metal having a low sheet-resistance such as aluminium with a width as large as possible in layout.

However, with the recent increases in the memory capacity and in the density of the semiconductor memory circuit arrangement, it has been required to employ a fine patterning technique and/or bi-layer or stacked layers of polycrystalline silicon structure and the like. The above situation is the same for the CMOS memory circuit arrangement also, and particularly according to the layout of the group of memory cells, an extensive variation of chip size is caused. That is, although the mask pattern used for fabricating the circuit arrangement is subject to the fine patterning, the contact area between a power source wiring and the well region or the substrate cannot be simply reduced in view of the latch-up phenomenon. In addition, in the situation where the bi-layer polycrystalline silicon structure, for instance, the upper polycrystalline silicon layer containing N type impurities is used for a wiring for supplying the $V_{SS}$ power source, the direct ohmic electrical connection to a well region of a P-type or a substrate of a P-type is impossible, so that it is necessary that once the N doped polycrystalline silicon is connected with a metal such as aluminum, and further the metal is connected with the P type well or the P type substrate. As a result, although the bilayer polycrystalline silicon structure is incorporated for the purpose of effecting the high density of integration, the expected high density cannot be attained in a specified pattern, for instance, a group of memory cells because of the above mentioned indirect connection between the power source wiring and the well region or the substrate.

SUMMARY OF THE INVENTION

It is an object of the present invention to provide an integrated circuit having a high-density of circuit structure.

It is another object of the present invention to provide a semiconductor memory device provided with a large memory capacity.

It is still another object of the present invention to provide a CMOS circuit having a high integration and operable without causing latch-up phenomena due to stray thyristor effect.

It is still another object of the present invention to provide a CMOS type semiconductor memory device of a high-density and operable with a low power consumption.

An integrated circuit according to the present invention comprises a semiconductor substrate of a first conductivity type, at least one impurity-doped region of a second opposite conductivity type formed in the semiconductor substrate, and at least three stacked wiring layers, the lowest layer being formed of polycrystalline silicon and including silicon gates of transistors formed on the impurity-doped region and the substrate, one of the upper layers being formed of polycrystalline silicon for feeding a power supply to some of the transistors in the impurity-doped region and being connected to the impurity-doped region, and the other of the upper layer being formed of high-conductivity metal.

In the above integrated circuit, the polycrystalline silicon as the above one of the upper layers is doped with an impurity of the first conductivity so that good ohmic contact is obtained between an impurity region formed in the impurity-doped region and the polycrystalline silicon. While this polycrystalline silicon as the one of upper layers is connected to the impurity doped region through a PN junction in reverse-direction formed therebetween, it would appear to the oridinarily skilled artisan that the impurity-doped region cannot be biased by the power supply through the reverse-direction PN junction. However, such PN junction is favorably formed by contacting highly doped polycrystalline silicon and the highly doped contact region in the impurity-doped region and hence the PN junction is very leaky like a resistor. Therefore, the impurity-doped region can be well biased by the leakage current of the PN junction so that the latch-up phenomena may be effectively prevented.

According to the present invention, it is possible to obtain a CMOS memory circuit arrangement in which a polycrystalline silicon used for a power source wiring and a well region or a substrate, which contains an impurity of conductivity type opposite to that contained in the polycrystalline silicon, are connected with each other in a junction state under the realization that the latch-up phenomenon is comparatively hardly caused in the memory cell matrix.

BRIEF DESCRIPTION OF THE DRAWINGS

FIGS. 5A to 5C are plan views respectively showing detailed layout patterns of FIG. 1.

DETAILED DESCRIPTION OF THE PREFERRED EMBODIMENT

Figure 1:
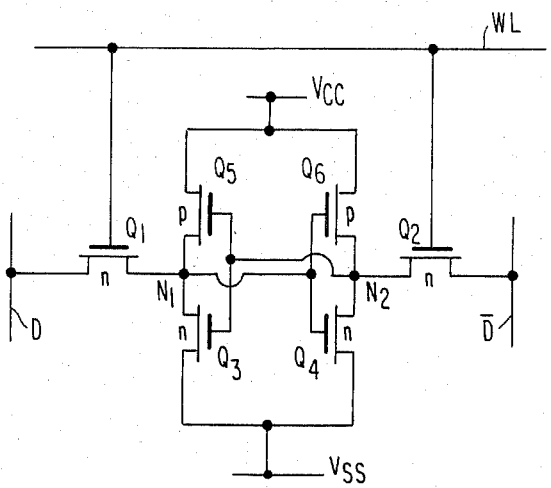
FIG. 1 is a circuit diagram illustrating a memory cell of CMOS static RAM.

First, with reference to FIG. 1, a general circuit structure of a CMOS type memory cell will be briefly explained.

In FIG. 1, a memory cell is composed of N-channel field effect transistors $Q_1$ to $Q_4$ and P-channel field effect transistors $Q_5$ and $Q_6$. The transistors $Q_3$ and $Q_5$ form a first inverter while the transistors $Q_4$ and $Q_6$ form a second inverter. An output of the first inverter and an input of the second inverter are commonly connected at a node $N_1$. An output of the second inverter and an input of the first inverter are commonly connected at a node $N_2$. The transistors $Q_1$ and $Q_2$ respectively connected between a true digit line D and the node $N_1$ and between a complement digit line $\overline{D}$ and the node $N_2$ operate as transfer gates in response to a logic level of a word line WL.

In the following, the present invention will be explained by referring to accompanying drawings in comparison with the conventional technique, for example, in the situation where the $V_{SS}$ power wiring is formed of the polycrystalline silicon doped with the N type impurity and the substrate is of N type while the well region is of P type.

Figure 2:
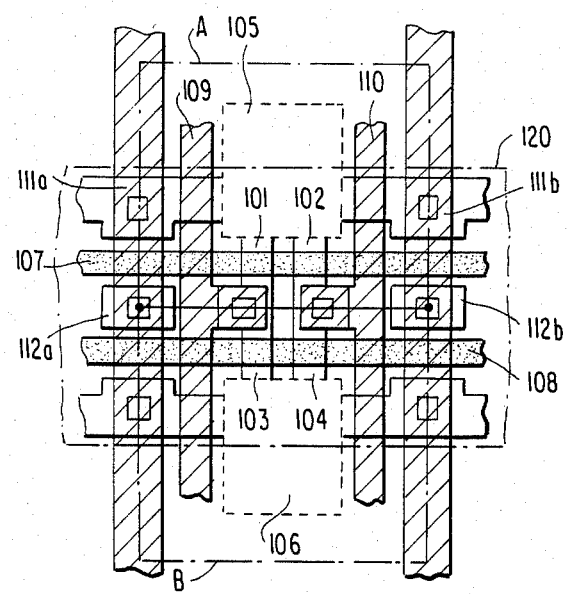
FIG. 2 is a plan view showing a conventional layout of a part of a memory cell matrix.

FIG. 2 shows a conventional layout of a memory cell matrix with respect to two memory cells A and B neighboring with each other. In this layout, one word line is formed of a laterally extended polycrystalline silicon 107. Portions 101 and 102 of the polycrystalline silicon 107 act as gates of the transfer gate transistors $Q_1$ and $Q_2$ in FIG. 1 for the memory cell A. Similarly, portions 103 and 104 of another word line 108 act as gates of the transfer gate transistors in the memory cell B. Layouts of flip-flop circuits formed of the mentioned first and second inverters in the cells A and B are indicated by reference numerals 105 and 106 respectively. True and complement digit lines D and $\overline{D}$ are formed of aluminum wirings 109 and 110 respectively. Next, $V_{SS}$ power wirings are formed of aluminum wirings 111a and 111b. High impurity-concentration P type diffusion regions 112a and 112b are employed for electrically connecting the P type well region 120 with the $V_{SS}$ power wirings 111a and 111b through openings provided on which region ohmic contacts are effected with the $V_{SS}$ power wirings 111a and 111b.

In the above conventional layout, it is impossible to reduce the pattern size of the memory elements because of the limit of space in the aluminum wirings of the $V_{SS}$ power wirings 111a and 111b and the digit lines 109 and 110. For removing this difficulty, it may be thought that the bilayer polycrystalline silicon structure is incorporated into the memory matrix and the upper layer of polycrystalline silicon which is used for the $V_{SS}$ power wiring. However, it has been conventionally regarded as impossible to perform the connection for the P type well region with other than such a metal as aluminum or a polycrystalline silicon containing the P type impurity, because of the required function of suppression of the latch-up phenomenon.

In contrast thereto, according to the present invention, the above conventional concept is cleared away, and, under the realization that the latch-up phenomenon is comparatively hardly caused in the memory cell matrix, the polycrystalline silicon used for the $V_{SS}$ power wiring doped with N type impurity is directly connected to the above mentioned P type well region in the junction state, whereby the latch-up phenomenon can be endured, and further the wiring limit caused by aluminum is removed, and the area occupied by the memory element can be reduced. As a result, the high density thereof can be attained.

Figure 3:
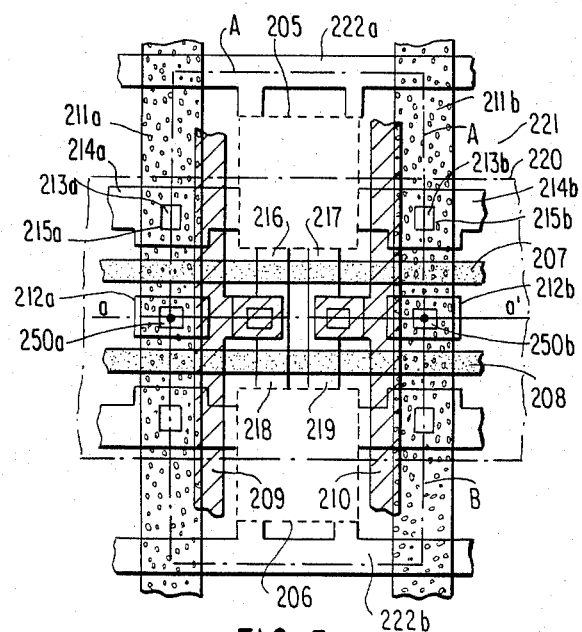
FIG. 3 is a plan view showing a part of a memory matrix according to one embodiment of the present invention.
Figure 4:
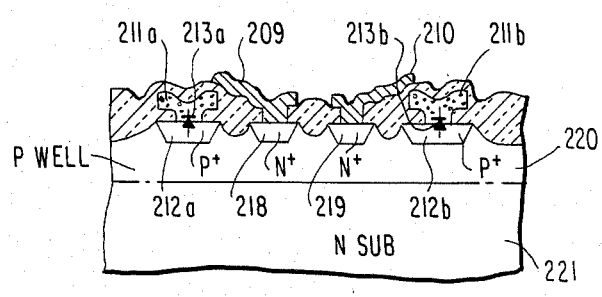
FIG. 4 is a cross sectional view corresponding to a line a—a' of FIG. 3.

With reference to FIGS. 3 and 4, an embodiment of the present invention will be described.

A P-type well region 220 for forming N-channel transistors is formed within an N-type semiconductor substrate 221. As is similar in FIG. 2, transfer gate transistors $Q_1$ and $Q_2$ of FIG. 1 are formed by the N-type polycrystalline silicon 207 as the word line, N type regions 216 and 217 as the nodes $N_1$ and $N_2$ of FIG. 1, and N type regions 218 and 219. To the regions 218 and 219 true and complement digit lines 209 and 210 formed of aluminum are connected through contact holes. The $V_{CC}$ wirings 222a and 222b are formed by a P-type region extended to drains of the transistors $Q_5$ and $Q_6$ of FIG. 1.

In this figure, the $V_{SS}$ wirings 211a and 211b are formed of a polycrystalline silicon which is formed on the layer above the silicon layer forming the word lines 207 and 208 and doped with an N-type impurity. The digit lines 211a and 211b are connected to N type regions 214a and 214b coupled to the sources of the transistors $Q_3$ and $Q_4$ through contact holes 215a and 215b, and this connection is performed by an ohmic contact between the same conductivity (N) type silicon layers 211a and 211b and region 214a or 214b. In other words, the conductivity type of the silicon 211a and 211b is determined so as to provide a current between the regions 214a and 214b and the $V_{SS}$ wirings 211a and 211b. The polycrystalline silicon wirings 211a and 211b are also directly connected to P+ contact regions 212a and 212b formed in the P type well region 220 through a contact hole. The polycrystalline silicon wirings 211a and 211b are admitted to be superposed on a part of the digit line wirings 210 and 209 formed of aluminum.

Thus, continuous and simple wirings are provided from the starting point to the ending point of the memory cell matrix, and further an aluminum wiring for the ohmic contact with the P type diffusion layer can be avoided. With the polycrystalline silicon wirings 211a and 211b, the wiring limit caused by the aluminum $V_{SS}$ wiring can be removed, whereby the pattern area occupied by each memory cell can be reduced. Under this circumstance, it can be regarded equivalently that diodes 213a and 213b are inserted between the P type well 220 and the $V_{SS}$ power wirings 211a and 211b with a forward-direction from the P type well towards the $V_{SS}$ power wirings 211a and 211b.

In other words, in view of supplying the $V_{SS}$ power to the well region 220, the diodes 213a and 213b operate in a reverse-direction to block the current to the well region 220 and hence biasing of the well region 220 would not appear to be performed. However, rectifying the characteristics of the PN junctions of the diodes 213a and 213b are not ideal, but they rather act leaky like resistors. This seems to be caused by the junction between the highly doped N type polycrystalline silicon (211a and 211b) and the highly doped P+ regions 212a and 212b. Therefore, the P-type well region 220 can be sufficiently biased by the diodes 213a and 213b.

Furthermore, in the case that these diodes are employed only for the memory cell matrix where the latch-up phenomenon is comparatively hardly caused, even if these diodes have insufficient current performance, many of similar diodes are connected in parallel in the memory cell matrix, and there is substantially no difficulty caused in practical use.

As is apparent from the above, according to the present invention, the high density integration of the CMOS memory circuit arrangement, particularly, inside the memory cell matrix thereof, can be attained.

Next, with reference to FIGS. 5 and 6, a detailed layout example and the effect of the present invention in comparison with the conventional layout will be described.

In the following explanation, the same layout rule is applied to the layouts of FIGS. 5 and 6, where each contact hole is formed with a rectangular share of 2.4 $\mu m \times 2.8$ $\mu m$ and aluminum wirings have their width of 3.7 $\mu m$. Polycrystalline silicon wirings as the word lines and interconnections in the flip-flop circuits are of 3.3 $\mu m$ width. In FIGS. 5 and 6, the same reference numerals and codes are utilized to indicate portions as those of FIGS. 1 to 4 for better understanding.

Throughout FIGS. 5A to 5C which show the conventional technique corresponding to FIG. 2, marks "+" are used to indicate reference points for layout aligning.

The P well region 120 and the respective P and N type impurity-doped regions are shown in FIG. 5A, with respect to neighboring two memory cells. Areas denoted by $Q_1$ and $Q_6$ are channel regions corresponding to the transistors $Q_1$ and $Q_6$ of FIG. 1. FIG. 5B shows a layout pattern of the first level polycrystalline silicon with which the word lines 107 and 108 and interconnections 131 and 132 for forming the flip-flop circuit are formed. FIG. 5C shows a layout of aluminum wirings 109 and 110 as the digit lines D and $\overline{D}$, and the $V_{SS}$ lines 111a and 111b. Wirings 141 and 142 are to connect the polycrystalline silicon wirings 131 and 132 to the P type and N type regions with ohmic contacts.

As shown in FIG. 5C, in the conventional layout of the memory cell matrix corresponding to FIG. 2, each of the memory cells is arranged in a rectangular region having a length of 37 $\mu m$ and a width of 41.4 $\mu m$. In this layout, wirings 151 and 152 forming circuit connections as well as gates of the transistors $Q_3$ to $Q_6$ are made of the same level of polycrystalline silicon of N-type as the word lines 107 and 108.

With reference to FIGS. 6A to 6D, the detailed layout patterns of the respective layers according to the present invention will be described.

Figure 6A:
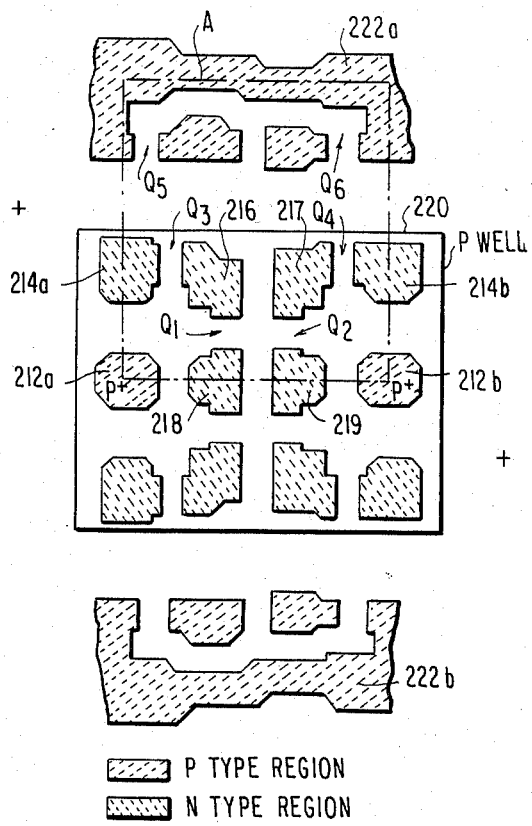
FIGS. 6A to 6D are plan views respectively showing detailed layout patterns.

The layout of the P well region 220 and the respective impurity regions are shown in FIG. 6A.

The regions denoted by the reference codes $Q_1$ and $Q_6$ are the channel regions conesponding the transistors $Q_1$ to $Q_6$ of FIG. 1. The P type region 222 is used to feed the Vss power supply to the memory cells.

Figure 6B:
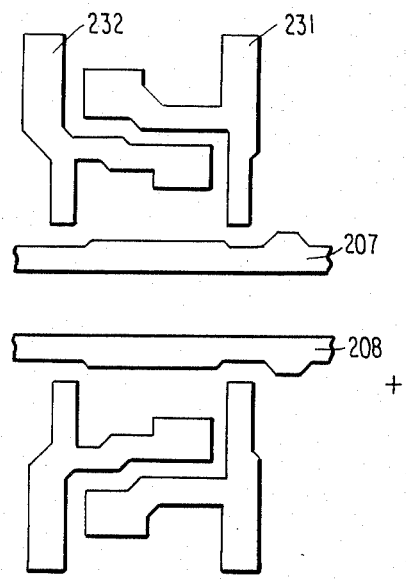

FIG. 6B shows a layout of the first level of the polycrystalline silicon forming the word lines 207 and 208, and the interconnection wirings 231 and 232 forming the flip-flop circuit of the memory cell.

Figure 6C:
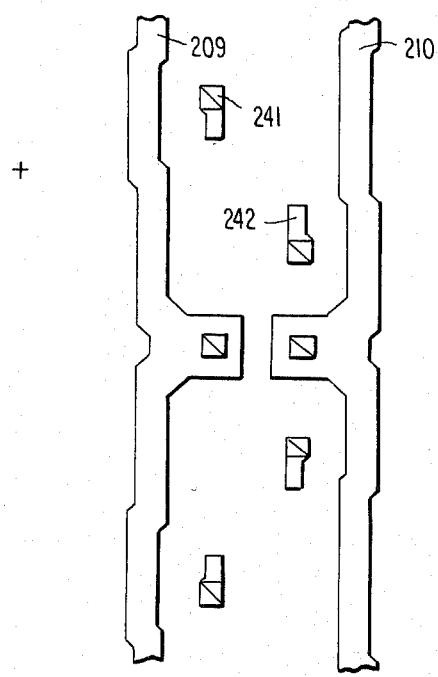

FIG. 6C shows a layout of the aluminum wirings. The wirings 209 and 210 form the word lines D and $\overline{D}$. The wirings 241 and 242 are contact connections between the wirings 231, 232 and the impurity regions.

Figure 6D:
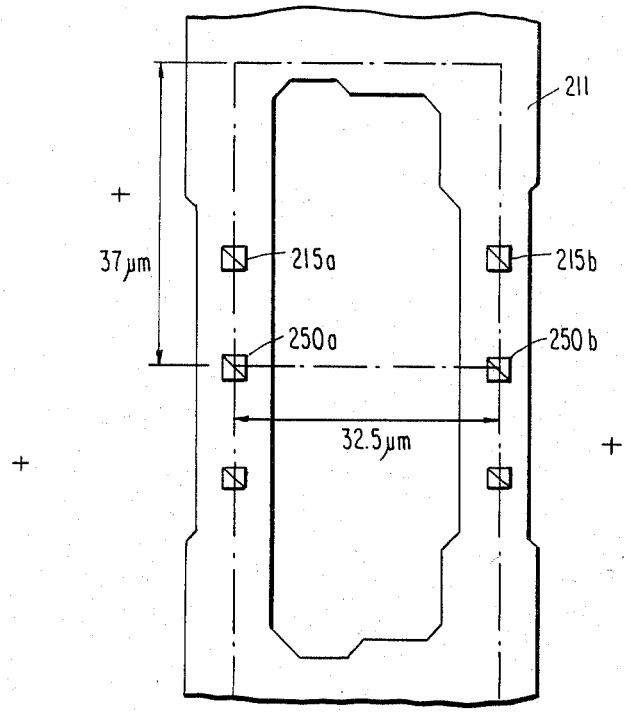

FIG. 6D shows the second level of porycrystalline silicon introduced by the present invention. In this example, for reducing a resistance, the polycrystalline silicon 211 is formed in a mesh-like manner along the peripheral edge of the respective memory cells.

Through the contacts 215a and 215b, the polycrystalline silicon 211 is connected to the N type region 214 while, through the contacts 216a and 216b, the polycrystalline silicon 211 is also directly connected to the P+ contact region in the D well region 220.

As shown throughout FIGS. 6A to 6D, especially in FIG. 6D in the layout according to the embodiment of the present invention, each of the memory cells is formed on a relatively small region having a length of 37 $\mu m$ and a width of 32.5 $\mu m$. In this layout, the wirings 251 and 252 for connecting the transistors $Q_3$ to $Q_6$ are formed of the same level of polycrystalline silicon as those for the word lines 207 and 208. As described above, according to the present invention, about a reduction in size of about 22% can be achieved in the memory cell matrix without losing the latch-up phenomena suppression function.

Although the above embodiment is described regarding the situation where the $V_{SS}$ power wiring formed of the polycrystalline silicon with the N type impurity, the N type substrate and the P type well regions is employed, the matter can be similarly effected by connecting the P-type polycrystalline silicon with the N type diffusion layer forming a part of the N type well even in the situation where the $V_{SS}$ power wiring formed of the polycrystalline silicon doped with the P type impurity, the P type substrate and the N type well regions is employed instead.

I claim:
1. An integrated circuit, comprising:
   a semiconductor substrate of a first conductivity,
   a first region of a second conductivity type formed in said semiconductor substrate and having a high impurity concentration portion of said second conductivity type therein,
   at least one field effect transistor formed on said first region and having a plurality of second regions of said first conductivity type formed in said first region,
   a first insulating layer formed on said semiconductor substrate and having a first opening exposing said high impurity concentration portion and a second opening exposing a part of at least one of said second regions,
   a first wiring made of polycrystalline silicon of said first conductivity type formed on said first insulating layer and directly contacting with said high impurity concentration portion through said first opening thereby to provide a PN junction having a resistance component therebetween, and with said part of said at least one of said second regions through said second opening, and
   means for supplying said first wiring with a predetermined voltage, in which said first region is continuously biased at said predetermined voltage through said resistance component of said PN junction.

2. The circuit according to claim 1, further comprising a second wiring made of polycrystalline silicon, a part of said second wiring forming a gate of said field effect transistor.

3. The circuit according to claim 1, further comprising at least one further field effect transistor having a plurality of third regions of said second conductivity type as the source and drain thereof formed in said semiconductor substrate.

4. A semiconductor integrated circuit, comprising:
a first semiconductor region of a first conductivity type,
a field effect transistor formed on said first semiconductor region and having a plurality of second regions of a second conductivity type located at a surface portion of said first semiconductor region,
a third region of said first conductivity type located at said surface portion of said first semiconductor region, said third region having a higher impurity concentration than said first semiconductor region,
an insulating layer covering said surface portion of said first semiconductor region and having a first opening exposing a part of at least one of said second regions and a second opening exposing a part of said third region,
a first polycrystalline silicon layer doped with impurities of said second conductivity type and directly contacted with the exposed part of said at least one of said second regions through said first opening and directly contacted with the exposed part of said third region through said second opening, and
means for supplying said first polycrystalline layer with a predetermined voltage, wherein said first semiconductor region is are continuously biased with said predetermined voltage through a resistance component formed between said third region and said first polycrystalline silicon layer.

5. The circuit according to claim 1, further comprising a second polycrystalline silicon layer having a part serving as a gate of said transistor.

6. The circuit according to claim 4, further comprising a high-conductivity metal, a part of said high-conductivity metal being superposed on a part of said polycrystalline silicon layer via said insulating layer.

7. A semiconductor memory device comprising a semiconductor substrate of a first conductivity type, a plurality of first regions of a second conductivity type formed in said semiconductor substrate each including a high impurity concentration region of said second conductivity type therein, a plurality of memory cells arranged in a matrix form on said semiconductor substrate, each of said memory cells including a first field effect transistor having a plurality of second regions of said first conductivity type formed on the associated one of said first regions and a second field effect transistor formed on an area of said semiconductor substrate other than said first regions, a first insulating layer formed on said semiconductor substrate and having a plurality of first openings exposing a part of each of said high impurity concentration regions and a plurality of second openings for exposing a part of at least one of said second regions in each of said first regions, a first level of polycrystalline silicon formed on said first insulating layer and serving as a gate of said first and second transistors, a second level of polycrystalline silicon doped with impurities of said first conductivity type formed on said first insulating layer with a spaced-apart relation with said first level of polycrystalline silicon, said second level of a polycrystalline silicon directly contacted with said part of each of said first regions through said high impurity concentration regions thereby to provide leaky PN junctions for providing a resistance between said second level of polycrystalline silicon and said first regions, and said second level of polycrystalline silicon being directly contacted with said part of said second region in each of said first regions through said second opening, and a means for supplying said second level of polycrystalline layer with a reference potential, wherein said first regions are continuously biased at said reference potential through said resistance.

8. The device according to claim 7, further comprising a highly conductive metal layer formed on said first insulating layer in spaced-apart relation with said first level of polycrystalline silicon and said second level of polycrystalline silicon.

9. The device according to claim 7, in which said first level of polycrystalline silicon is doped with impurities of said first conductivity type.

10. A memory integrated circuit comprising a semiconductor substrate of a first conductivity type, a memory cell matrix formed on a matrix area of said semiconductor substrate, said memory cell matrix including a plurality of memory cells arranged in rows and columns, a plurality of first regions of a second conductivity type formed on said matrix area, each of said first regions having a high impurity concentration region of said second conductivity type therein, each of said memory cells including a pair of load transistors, a pair of switching transistors and a pair of transfer gate transistors, said pair of switching transistors and a said pair of transfer gate transistors being formed on the corresponding one of said first regions and having a plurality of second regions of said first conductivity as sources and drains therein, said pair of load transistors being formed on a part of said matrix area separate from and near said corresponding one of said first regions, a first insulating layer formed on said semiconductor substrate and having a plurality of high impurity concentration openings each exposing a high impurity concentration region of each of said first regions and a plurality of second openings exposing a part of at least one of said second regions, and first to third wiring layers electrically isolated from one another by insulating layers, said first wiring layer being formed of polycrystalline silicon and serving as gates of said transfer gate transistors, said second wiring layer being formed of polycrystalline silicon doped with impurities of said first conductivity type and directly contacted with said part of said second region through said second openings and with said exposed high impurity concentration region of each of said first regions through said high impurity concentration openings to form PN junctions between said second wiring layer and each of said first regions, and said second wiring layer serving as a power supply path, means for supplying said second wiring layer being formed of a high-conductivity of metal and including a plurality of data lines formed on said matrix area, in which said first regions are continuously biased at said predetermined voltage through each of said PN junctions in a reverse biased state of each said PN junction.

11. A semiconductor integrated circuit comprising: a semiconductor substrate of a first conductivity type, a plurality of first regions of a second conductivity type, formed in said substrate, a plurality of second regions of said second conductivity type having a higher impurity concentration than said first regions and formed in said first regions, a plurality of static-type memory cells formed on said semiconductor substrate in a matrix form of rows and columns, a word line for each row, and first and second digit lines for each column, each of said memory cells including first and second transistors each having a third region of said first conductivity type formed in said first region as one of a source and drain and a fourth region of said first conductivity type formed in said first region as the other of said source and drain, a gate of said first transistor being connected to the third region of said second transistor, a gate of said second transistor being connected to the third region of said first transistor, a third transistor having said third region of said first transistor as one of a source and drain, a fifth region of said first conductivity type formed in said first region as the other of the source and drain, and a gate coupled to said word line, and a fourth transistor having said third region of said second transistor as one of a source and drain, a sixth region of said first conductivity type formed in said first region as the other of the source and drain, and a gate coupled to said word line, an insulating layer covering a surface of said semiconductor substrate, first and second voltage lines formed on said insulating layer for each column and extending in a column direction in parallel, said first and second voltage lines being respectively formed of first and second polycrystalline silicon layers both of said first conductivity type, said first and second polycrystalline silicon layers of said first conductivity type being contacted with respective second regions of said second conductivity type with leaky PN junctions therebetween, said first polycrystalline silicon layer being further contacted with said fourth regions of said first transistors of the memory cells in the corresponding column, said second polycrystalline silicon layer being further contacted with said fourth regions of said second transistors of the memory cells in the corresponding column, said first and second digit lines being respectively formed of first and second high-conductivity metal layers which extend in the column direction in parallel with said first and second polycrystalline silicon layers, said first metal layer being contacted with said fifth regions of said third transistors of the memory cells in the corresponding column, said second metal layer being contacted with said sixth regions of said fourth transistors of the memory cells in the corresponding column, said first metal layer partially overlapping said first polycrystalline silicon layer via said insulating layer, and second second metal layer partially overlapping said second polycrystalline silicon layer, and means for supplying said first and second voltage lines with a predetermined potential, wherein said first regions are continuously biased at said predetermined potential by said first and second polycrystalline silicon layers through said leaky PN junctions and said fourth regions of said first and second transistors are continuously biased at said predetermined potential by said first and second polycrystalline silicon layers.

12. The integrated circuit according to claim 11, further comprising at least one further polycrystalline silicon layer forming gates of said first to fourth transistors in each memory cell.

13. A semiconductor integrated circuit, comprising:
a semiconductor substrate of a first conductivity type,
a memory cell matrix formed on a matrix area of said semiconductor substrate, said memory cell matrix including a plurality of memory cells arranged in rows and columns,
a plurality of first regions of a second conductivity type formed on at least said matrix area and including high impurity concentration portions therein, each of said memory cells including a flip-flop circuit having a pair of load transistors, a pair of switching transistors, and a pair of transfer gate transistors, said pair of switching transistors and said pair of transfer gate transistors being formed on one of said first regions, said pair of load transistors being formed on a part of said matrix area separate from and near said one of said first regions,
a plurality of pairs of voltage lines formed of a first polycrystalline silicon layer of said first conductivity type, each pair of voltage lines being directly contacted to respective ones of said high impurity concentration portions thereby to form leaky PN junctions having resistance components therebetween in a corresponding column in parallel and applying a predetermined voltage to the flip-flops in said corresponding column, and
a plurality of pairs of data lines formed of a high-conductivity metal layer, each pair of data lines extending in the corresponding column in parallel and partially overlapping the corresponding pair of voltage lines, wherein said first regions are continuously biased at said predetermined voltage through said resistance components of said PN junctions.

* * * * *

UNITED STATES PATENT AND TRADEMARK OFFICE
CERTIFICATE OF CORRECTION

PATENT NO. : 4,524,377

DATED : June 18, 1984

INVENTOR(S) : Hirotugu EGUCHI, Tokyo Japan

It is certified that error appears in the above-identified patent and that said Letters Patent is hereby corrected as shown below:

Column 1, line 33, delete "of" and insert --a--.

Column 5, line 32, delete "and" and insert --to--.

lines 55 & 56, delete "and" and insert --to--.

line 56, change "conesponding" to --corresponding--.

Column 6, line 17, delete "about".

Column 7, line 25, delete "are".

Column 9, line 41, delete "second" (second occurrence).

Signed and Sealed this

Seventeenth Day of December 1985

[SEAL]

Attest:

DONALD J. QUIGG

Attesting Officer  Commissioner of Patents and Trademarks